(12) United States Patent
Nguyen

(10) Patent No.: US 6,445,228 B1
(45) Date of Patent: Sep. 3, 2002

(54) PROGRAMMABLE EVEN-NUMBER CLOCK DIVIDER CIRCUIT WITH DUTY CYCLE CORRECTION AND OPTIONAL PHASE SHIFT

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/942,230

(22) Filed: Aug. 28, 2001

(51) Int. Cl.[7] .............................. G06F 1/04; H03K 5/13
(52) U.S. Cl. ........................................ 327/115; 327/117
(58) Field of Search .................................. 327/115, 117, 327/113; 377/47

(56) References Cited

U.S. PATENT DOCUMENTS 4,686,386 A    8/1987  Tadao ........................ 327/143
5,675,273 A  * 10/1997  Masleid ...................... 327/156
6,061,418 A    5/2000  Hassoun ..................... 327/115
6,239,627 B1 * 5/2001  Brown et al. ................ 327/116

FOREIGN PATENT DOCUMENTS

EP          0 385 567 A2    5/1990

* cited by examiner

Primary Examiner—Dinh T. Le
(74) Attorney, Agent, or Firm—Lois D. Cartier

(57) ABSTRACT

A clock divider circuit includes a state machine that receives an input clock signal and generates mutually exclusive set and reset control signals. The set and reset control signals are used to control set and reset passgates, respectively, selectively providing the input clock signal to the gate terminals of a pullup and a pulldown on the output node. The set and reset control signals are also provided to a keeper circuit that maintains a value placed on the output node.

16 Claims, 17 Drawing Sheets

US 6,445,228 B1

PROGRAMMABLE EVEN-NUMBER CLOCK DIVIDER CIRCUIT WITH DUTY CYCLE CORRECTION AND OPTIONAL PHASE SHIFT

FIELD OF THE INVENTION

The invention relates to clocking circuits for digital systems. More specifically, the present invention relates to a variable even-number clock divider circuit having duty cycle correction and optional phase shift.

BACKGROUND OF THE INVENTION

Digital circuits such as board level systems and integrated circuit (IC) devices, including programmable logic devices (PLDS) and microprocessors, use clocking signals for a variety of reasons. For example, synchronous systems use global clock signals to synchronize various circuits across the board or IC device.

However, as the complexity of digital circuits increases, clocking schemes for synchronous systems become more complicated. Many complex digital circuits such as PLDs and microprocessors have multiple clock signals at different frequencies. For example, in some microprocessors, internal circuits are clocked by a first clock signal at a first frequency while input/output (I/O) circuits are clocked by a second clock signal at a second frequency. Typically, the second frequency is slower than the first frequency.

Multiple clock generating circuits can be used to generate the multiple clock signals. However, clock generating circuits typically consume a large amount of device or board space. Therefore, most systems use one clock generating circuit to generate a first clock signal and a specialized circuit to derive other clock signals from the first clock signal. For example, clock dividers are used to generate one or more clock signals of lower clock frequencies from an input clock signal.

FIG. 1A shows a conventional clock divider 100 that receives an input clock signal ICLK and generates a divided-by-two clock signal CLKD2, a divided-by-four clock signal CLKD4, a divided-by-eight clock signal CLKD8, and a divided-by-sixteen clock signal CLKD16. (In the present specification, the same reference characters are used to refer to terminals, signal lines, and their corresponding signals.) Clock divider 100 comprises a 4-bit counter 100. Input clock signal ICLK is applied to the clock terminal of 4-bit counter 110. 4-Bit counter 110 drives clock signals CLKD2, CLKD4, CLKD8, and CLKD16 on output terminals O0, O1, O2, and O3, respectively. Output terminals O0 through O3 provide the least significant bit through the most significant bit of 4-bit counter 100, respectively.

FIG. 1B is a timing diagram for clock divider 100. As can easily be seen from FIG. 1B, if input clock signal ICLK has a clock period P, then divide-by-two clock signal CLKD2 has a clock period of 2P. Similarly, divide-by-four clock signal CLKD4 has a period of 4P, and so forth. Thus, the frequency of clock signal CLKD2 is half the frequency of input clock signal ICLK, the frequency of clock signal CLKD4 is one-fourth the frequency of signal ICLK, and so forth.

Including a clock divider in an IC device typically carries a timing penalty, whether or not the clock divider is in use. FIG. 2A shows a first clock driver circuit in an IC where a clock divider is not included. The clock driver circuit 200 includes a driver 201 that accepts an input clock signal from clock pad 202, and applies the signal to clock tree 203. FIG. 2B shows a second clock driver circuit 210, which includes an optional clock divider 204. The designer can either include clock divider 204 in the circuit, or bypass the clock divider, under the control of multiplexer 205.

FIG. 2B clearly shows that whether or not the clock divider is included in the clock path, there is an additional delay D210 in the circuit of FIG. 2B compared to that of FIG. 2A. If the clock divider is bypassed, there is added delay in the bypass line and a propagation delay through the multiplexer 205. If the clock divider is included in the circuit, there are the added propagation delays of both the multiplexer and the clock divider. In either case, the total delay through the clock driver circuit is increased.

If a clock divider such as that shown in FIG. 1 is placed into the clock driver circuit of FIG. 2B, the result is a clock tree driven by a flip-flop (from 4-bit counter 110 of FIG. 1) through a multiplexer (e.g., multiplexer 205 of FIG. 2B). Clearly, neither a flip-flop nor an unbuffered multiplexer have the drive capability to drive a large clock tree—the resulting clock signal would be unacceptably slow and have a very high skew. Therefore, multiplexer 205 is typically buffered, for example, as shown in FIGS. 3A and 3B.

FIG. 3A shows a prior art clock driver circuit 320 that includes an inverting clock divider 314. Multiplexer 205 has been replaced by multiplexing circuit 325, which implements the logical equivalent of multiplexer 205 with the input signal from the clock divider inverted by inverter 306.

One implementation of multiplexing circuit 325, designated 325A in FIG. 3A, includes a tristate driver 326, to which the output of inverting clock divider 314 is applied, and passgate 327, to which the bypass clock signal is applied. By controlling the tristate control signal of tristate driver 326 and the passgate control signals of passgate 327, either the divided clock signal or the bypass clock signal is selected. Note, however, that the bypass clock signal is still not buffered in this embodiment, so another buffer (not shown) may be inserted after passgate 327 for heavily-loaded clock signals.

FIG. 3B shows a prior art clock driver circuit 330 that includes a non-inverting clock divider 324. Multiplexer 205 has been replaced by multiplexing circuit 335, which implements the logical equivalent of multiplexer 205 with an output signal buffered through buffer 309.

One implementation of multiplexing circuit 335, designated 335A in FIG. 3B, includes a first tristate driver 336, to which the output of non-inverting clock divider 324 is applied, and a second tristate driver 337, to which the bypass clock signal is applied. By controlling the tristate control signals of tristate drivers 336 and 337, either the divided clock signal or the bypass clock signal is selected. The selected clock signal is then inverted and buffered by inverter 339.

However, the clock driver circuits shown in FIGS. 3A and 3B have implicit additional delays that can be significant. The additional delay D320 added by the clock divider in FIG. 3A is the delay through clock divider 314 plus the delay through tristate driver 326. The additional delay D330 added by the clock divider in FIG. 3B is the delay through the clock divider 324 plus the delay through tristate driver 336 and inverter 339.

Delay through a clock driver circuit is an important parameter for IC designers. Using circuits similar to those shown in FIGS. 3A and 3B, the additional delay due to the presence of a clock divider can be significant, e.g., about 500 picoseconds. Like most timing parameters, this delay is typically specified as a worst-case value, to ensure operation of the device under worst-case conditions. Therefore, even when the clock divider is bypassed, the specifications for the device are based on the worst case scenario, i.e., the delay when the clock divider is included. Therefore, the additional delay on the clock path due to the presence of a clock divider not only delays the clock signal, it also makes the IC device appear to be slower than it really is.

For these and other reasons, it is advantageous to provide a clock divider circuit having a reduced delay.

SUMMARY OF THE INVENTION

The invention provides a novel clock divider circuit that adds very little additional delay to the clock driver containing the circuit. Further, according to one embodiment, the clock divider circuit of the invention provides the capability to divide by any even number, rather than being limited to powers of two as are many clock dividers. The delay through the clock divider circuit is the same, regardless of which even number is selected as the divisor.

In one embodiment of the invention, a clock divider circuit includes a state machine that receives the input clock signal and generates set and reset control signals. The set and reset control signals are used to control set and reset passgates, respectively, selectively providing the input clock signal to the gate terminals of a pullup and a pulldown, respectively, on the output node. The set and reset control signals are also provided to a keeper circuit that maintains a value placed on the output node.

An advantage of this circuit is that the delays typical of prior art clock dividers (D-flip-flop delays, multiplexer delays, and so forth) are shifted from the clock path to the path including the set and reset control signals. Therefore, these delays are not on the clock path, i.e., not on the critical path for the clock divider circuit.

Another advantage is that by controlling the functionality of the state machine, any even number (up to the capacity built into the state machine) can be selected as the divisor for the clock divider circuit. Therefore, the clock divider circuit of the invention provides additional flexibility compared to many known clock dividers.

In one embodiment, a phase bit is provided. The phase bit allows the user to either start the clock divider circuit at the first rising edge of the input clock or to delay the clock divider circuit for a predetermined number of clock cycles.

In another embodiment, the clock divider circuit is designed to complete the last high pulse (e.g., to clock in the most recent data value) if the user miscounts the number of clock cycles and mistakenly resets the clock in the middle of the clocking process.

According to another aspect of the invention, a clock driver circuit includes an input buffer, a bypass passgate, and a tristateable clock divider circuit. Rather than using a multiplexer circuit to select between the bypass signal and the output of the clock divider circuit, the clock divider circuit can be tristated. Thus, when the clock divider circuit is tristated and the bypass passgate is on, the bypass signal is passed to the clock driver circuit output. When the clock divider circuit is active (not tristated) and the bypass passgate is off, the divided clock signal is passed to the clock driver circuit output. Thus, the additional delay added by the multiplexer circuit used in conventional clock divider circuits is omitted.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

In the following description, numerous specific details are set forth to provide a more thorough understanding of the present invention. However, it will be apparent to one skilled in the art that the present invention may be practiced without these specific details.

Figure 4:
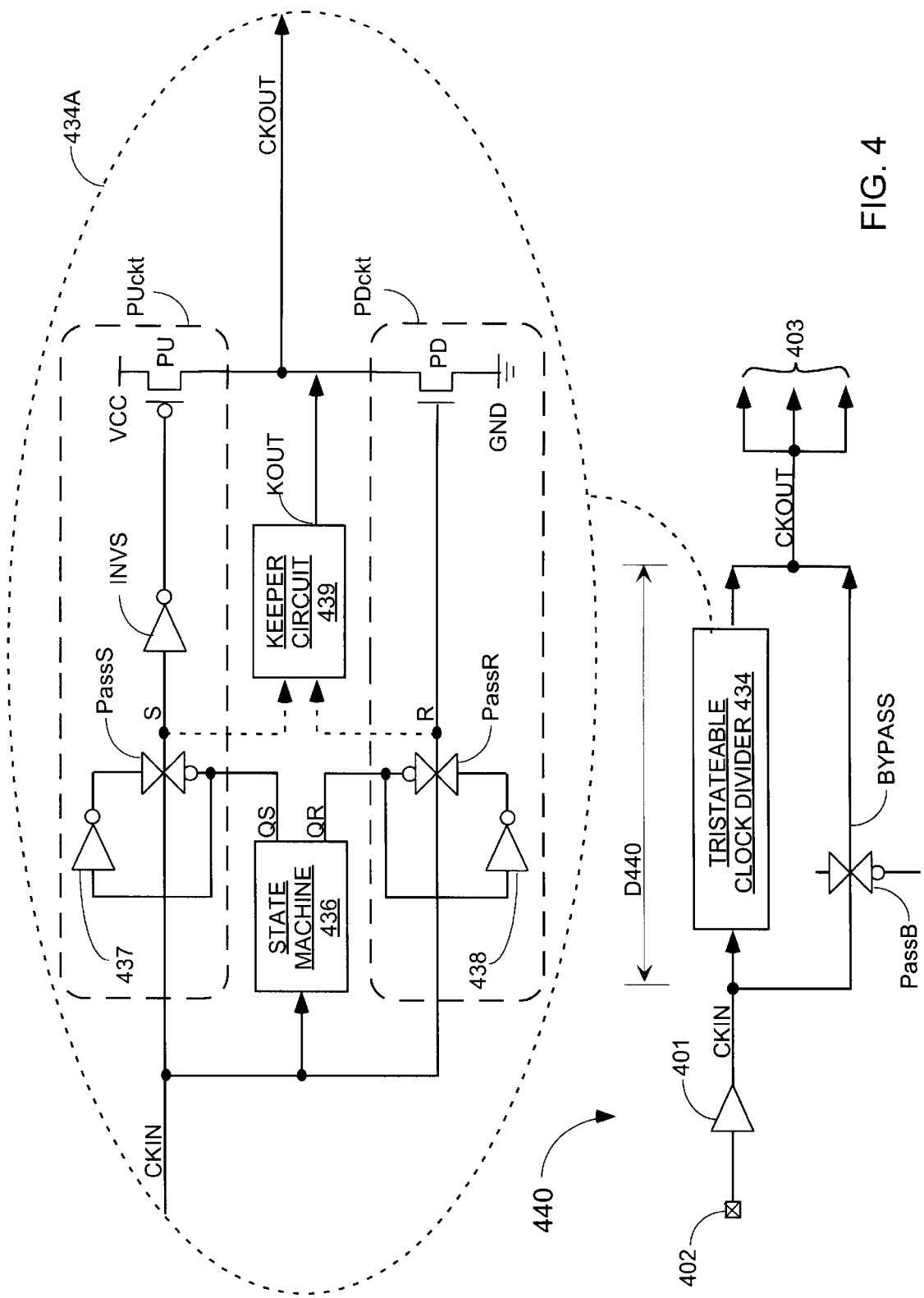
FIG. 4 is a block diagram of a first driver circuit including a tristateable clock divider according to a first embodiment of the invention.

FIG. 4 shows a clock driver circuit 440 that includes a clock pad 402, an input buffer 401, a bypass passgate PassB, and a clock divider circuit 434. Unlike prior art clock driver circuits, clock driver circuit 440 does not include a multiplexer to select between the output of clock divider circuit 434 and a bypass clock signal. Instead, clock divider circuit 434 is internally tristateable. When clock divider circuit 434 is tristated (i.e., at high impedance) and passgate PassB is on, the bypass clock signal is passed to the clock tree 403. When clock divider circuit 434 is active and passgate PassB is off, the divided clock signal is passed to clock tree 403.

Circuit 434A in FIG. 4 shows one implementation of tristateable clock divider 434. In this embodiment of the invention, the tristateable clock driver circuit includes a state machine 436, a pullup circuit PUckt, a pulldown circuit PDckt, and a keeper circuit 439.

State machine 436 receives clock divider input clock signal CKIN and generates set and reset control signals (QS and QR, respectively). When control signal QS is low, a rising edge on input clock CKIN is passed to node "S", and hence to output signal CKOUT. When control signal QR is low, a rising edge on input clock CKIN is passed to node "R", and hence to a falling edge on output signal CKOUT. Nodes S and R are preferably initialized to low and high values, respectively, by way of a pulldown and pullup (not shown) gated by a reset signal (also not shown). State machine 436 keeps track of where input signal CKIN is in the "divided" clock cycle, and generates the appropriate voltage levels on QS and QR to drive the output clock signal high and low at the appropriate times. For example, when the divisor is six, each of control signals QS and QR pulses low for one CKIN clock cycle in every six.

In one embodiment, the state machine accommodates only one divisor. In other embodiments, the state machine is programmable, and accommodates a plurality of divisors.

In some embodiments, the state machine and clock divider circuit form a portion of a programmable logic device (PLD) such as a field programmable gate array (FPGA) or a complex programmable logic device (CPLD). In one such embodiment, the state machine is implemented using user-controlled programmable logic to perform a specific function in a particular design, and supports only one divisor.

In another embodiment, the clock divider and state machine circuits are implemented in dedicated logic (i.e., not using the user-controlled logic blocks). This dedicated logic, however, can be designed to be programmable. For example, in some embodiments a clock divider circuit is implemented in dedicated logic in a programmable logic device. The clock divider circuit includes a state machine that is configurable to support any of several divisors. In one such embodiment, where the PLD is a CPLD, the state machine is controlled by logic values stored in FLASH memory using the typical programming process for the CPLD. In this embodiment, the logic values are included in the CPLD configuration data file. In another such embodiment, where the PLD is an FPGA, the state machine is controlled by logic values stored in SRAM cells during the normal configuration process for the FPGA. In this embodiment, the logic values are loaded as part of a configuration bitstream.

Returning to FIG. 4, set control signal QS controls set passgate PassS, which selectively provides input clock signal CKIN to pullup PU. In the embodiment of FIG. 4, set passgate PassS is coupled to the input terminal of inverter INVS, which drives the gate of pullup PU. Reset control signal QR controls reset passgate PassR, which selectively provides input clock signal CKIN to pulldown PD.

In the pictured embodiment, pullup PU is a PMOS transistor, passgate PassS is a CMOS passgate controlled by set control signal QS and the same signal inverted by inverter 437, passgate PassR is a CMOS passgate controlled by reset control signal QR and the same signal inverted by inverter 438, and pulldown PD is an NMOS transistor. In other embodiments, other types of transistors and/or other circuits are used to implement pullup PU, pulldown PD, and passgates PassS and PassR. For example, passgates PassS and PassR can be implemented as NMOS transistors, PMOS transistors, tristate drivers, and so forth, while pullup PU can be implemented as an NMOS transistor if inverter INVS is omitted.

Set passgate PassS, inverters 437 and INVS, and pullup PU collectively comprise pullup circuit PUckt. Reset passgate PassR, inverter 438, and pulldown PD collectively comprise pulldown circuit PDckt.

Pullup PU and pulldown PD are coupled in series between power high (VCC) and ground (GND). The node between pullup PU and pulldown PD is coupled to the output terminal CKOUT of the clock divider.

The set S and reset R control signals are also provided to a keeper circuit 439, which is coupled to output terminal CKOUT. Keeper circuit 439 provides a weak output signal KOUT that reinforces the signal on output terminal CKOUT, such that the voltage level of the signal remains stored on the node when both pullup PU and pulldown PD are off. One embodiment of keeper circuit 439 is described in detail below, with relation to FIG. 15. However, keeper circuits are well known in the art, and any keeper circuit can be used in clock driver 434A, as long as it is weak enough to be overridden by both pullup PU and pulldown PD. For example, a weak cross-coupled latch with two inverters can be used as a weak keeper, with one of the inverters also driving signal CKOUT. This embodiment does not require signals S, R, and CDEN as inputs to the weak keeper.

Figure 1A:
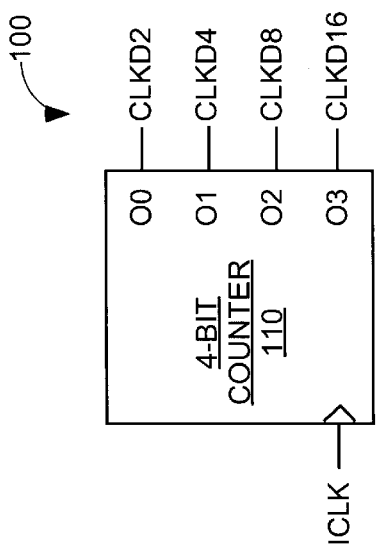
FIG. 1A is a block diagram of a conventional clock divider.
Figure 1B:
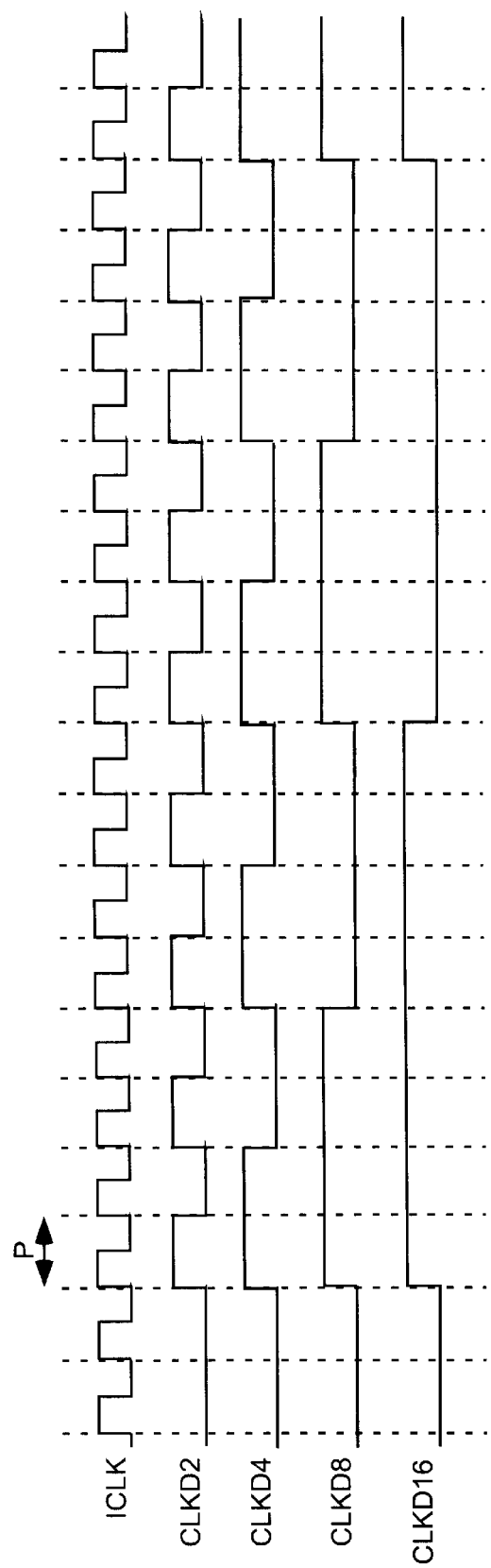
FIG. 1B is a timing diagram for the clock divider of FIG. 1A.
Figure 2A:
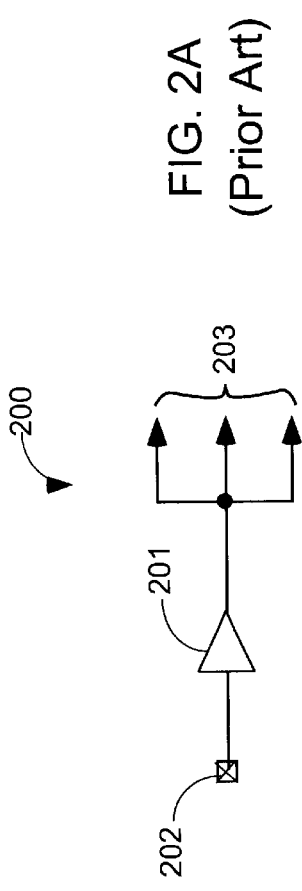
FIG. 2A is a block diagram of a conventional clock driver circuit not including a clock divider.
Figure 2B:
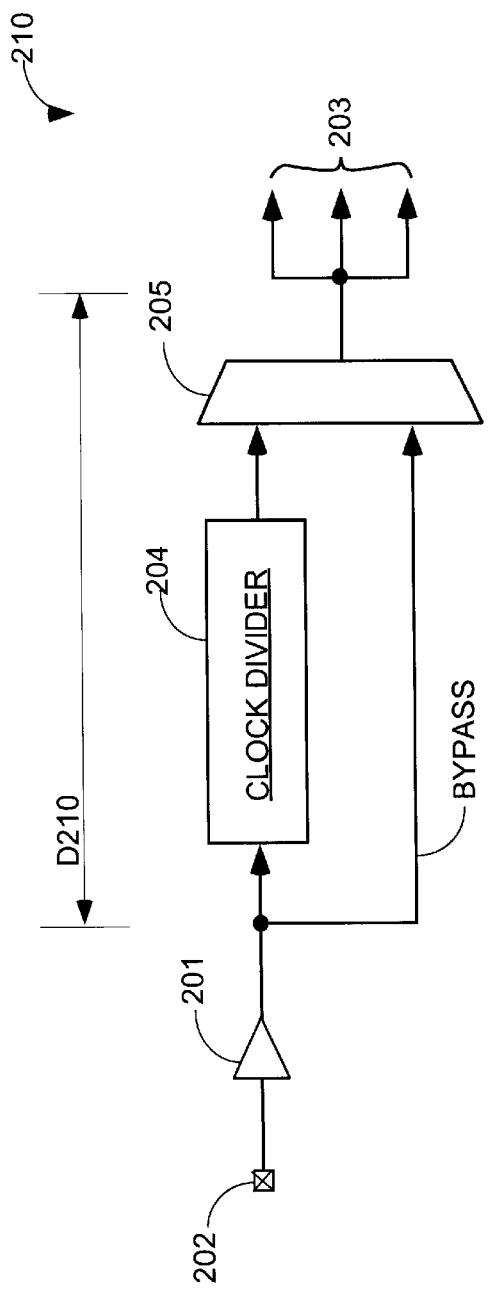
FIG. 2B is a block diagram of a conventional clock driver circuit including an optional clock divider.
Figure 3A:
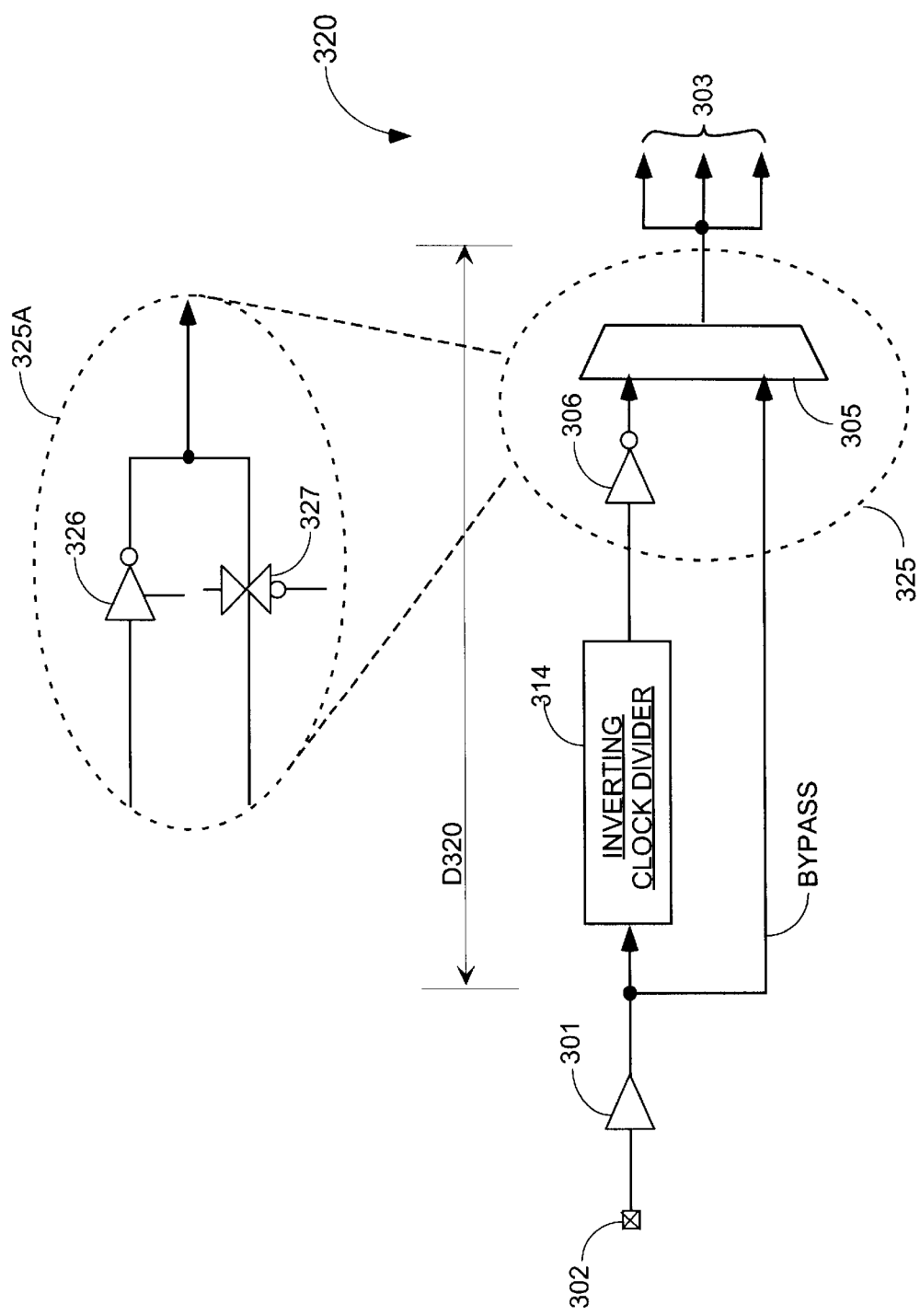
FIG. 3A is a block diagram of a conventional clock driver circuit including an inverting clock divider.
Figure 3B:
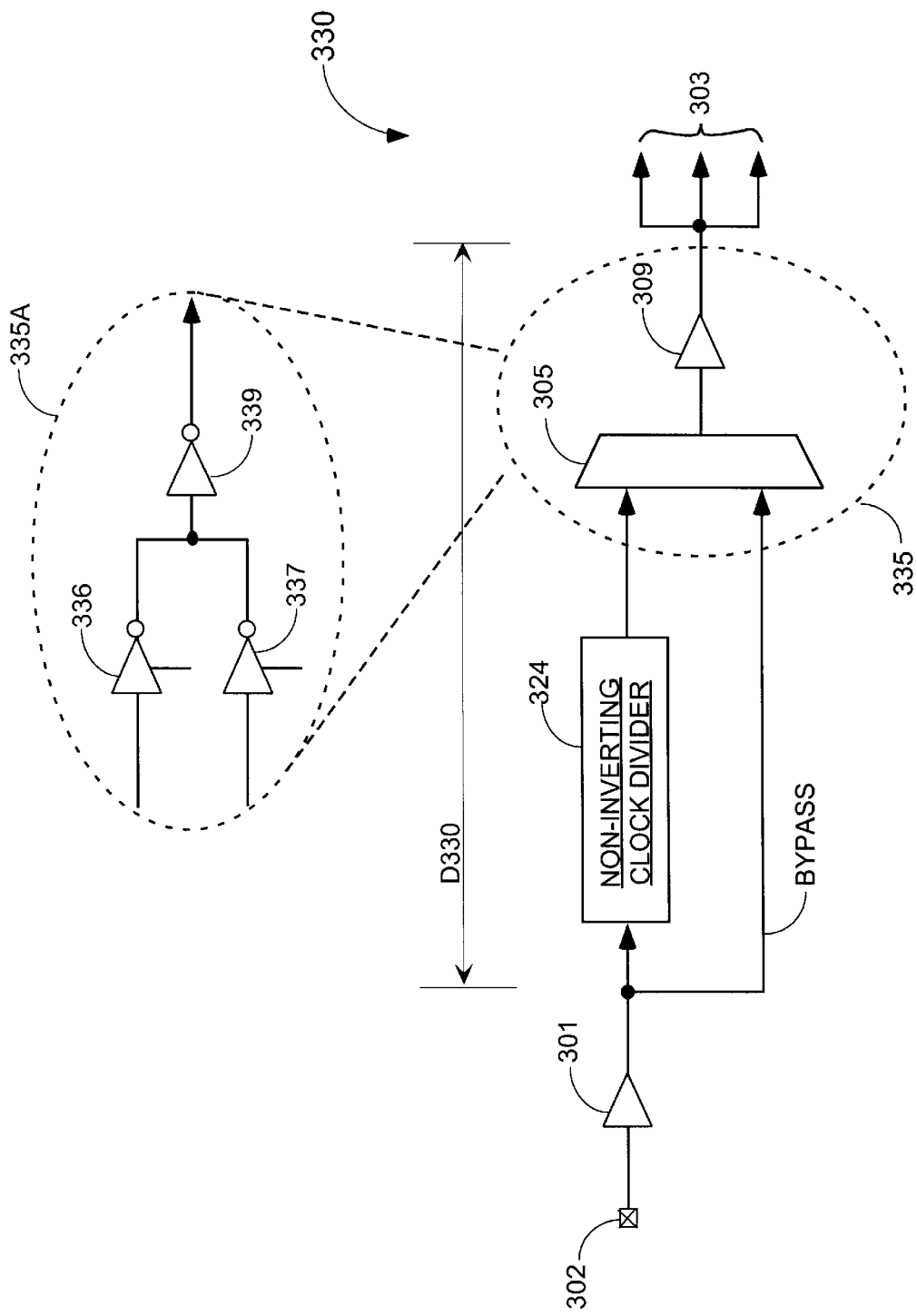
FIG. 3B is a block diagram of a conventional clock driver circuit including a non-inverting clock divider.

Set and reset control signals QS and QR are preferably mutually exclusive. That is, preferably state machine 436 does not allow signals QS and QR to be active at the same time. Therefore, pullup PU and pulldown PD are never both on at the same time, and there is no current flow between VCC and GND, nor transitory contention over which transistor will control the value on the CKOUT output terminal, as can occur in the conventional clock divider circuits shown in FIGS. 3A and 3B.

Note that the delay through clock driver circuit 434A for a rising clock edge includes only the delay through passgate PassS, inverter INVS, and pullup PU. The delay through clock driver circuit 434A for a falling clock edge includes only the delay through passgate PassR and pulldown PD. Therefore, the clock delay of clock driver circuit 440 is significantly shorter than the clock delay through, for example, clock driver circuits 320 and 330 of FIGS. 3A and 3B.

The novel circuit configuration of FIG. 4 has an additional advantage. In conventional clock drivers, the clock signal follows the same path through the driver for both falling and rising edges of the clock. Therefore, the circuit cannot be optimized for both edges; instead, some compromise must be reached that provides acceptable performance on both edges of the clock. However, in the circuit shown in FIG. 4, the pullup PU and pulldown PD are separately controlled. Therefore, the controlling transistors can each be optimized for the corresponding clock edge. In other words, a rising edge on output clock signal CKOUT is controlled by passgate PassS, inverter INVS, and pullup PU, while a falling edge on output clock signal CKOUT is controlled by passgate PassR and pulldown PD. Therefore, passgate PassS, inverter INVS, and pullup PU can be optimized to improve the performance of the rising edge of the output clock CKOUT, while passgate PassR and pulldown PD can be optimized to improve the performance of the falling edge of the output clock CKOUT. This optimization can be achieved, for example, through well-known methods involving circuit simulations performed on a computer.

For all of these reasons, the clock delay through clock driver circuit 434A is significantly lower than the delay through conventional clock driver circuits. As mentioned above, the delay added to a clock driver circuit using a conventional clock divider is typically about 500 picoseconds. However, when the same manufacturing technology is used, the delay added when using clock divider 434A can be as little as 90 picoseconds.

Programmable Clock Divider

Figure 6:
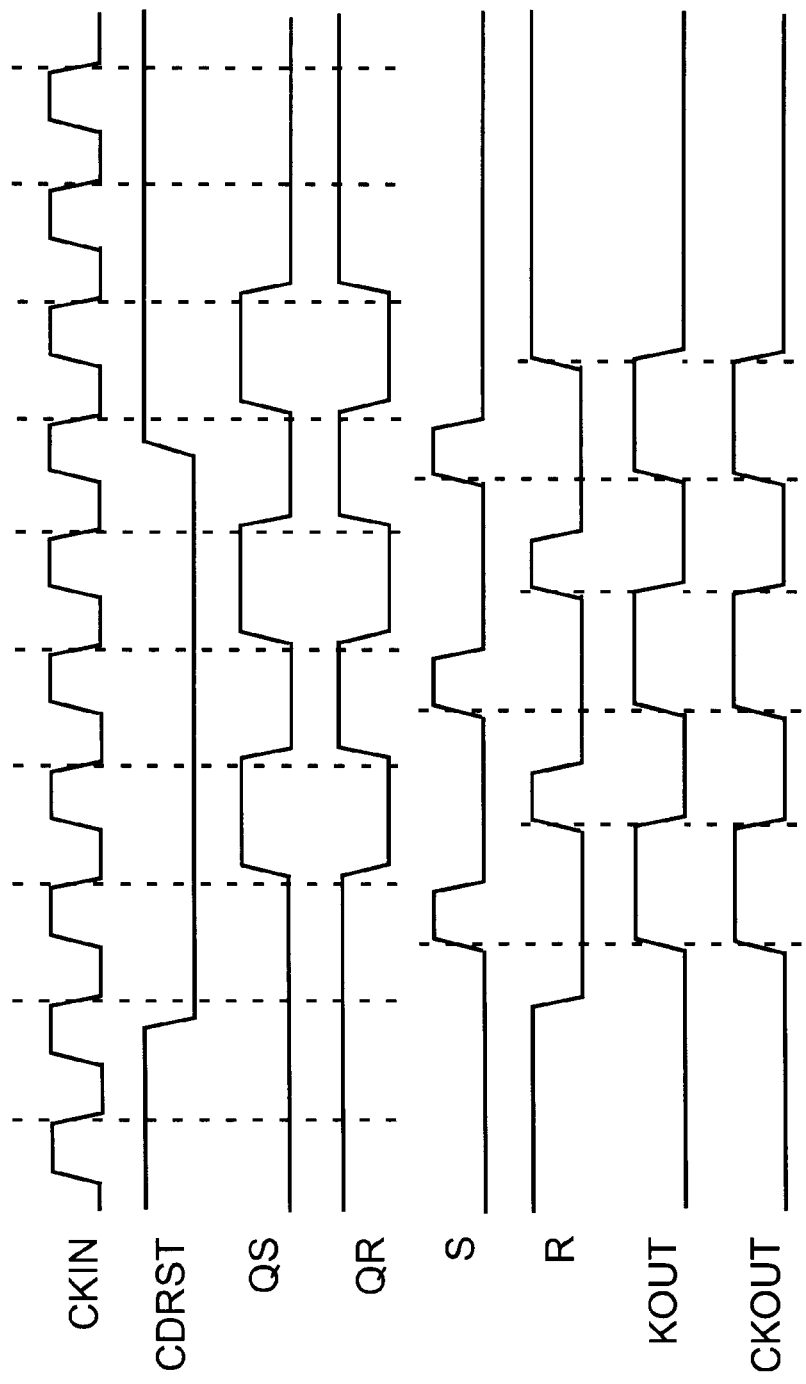
FIG. 6 is a timing diagram showing the operation of the clock divider circuit of FIG. 5 in divide-by-2 mode.
Figure 7:
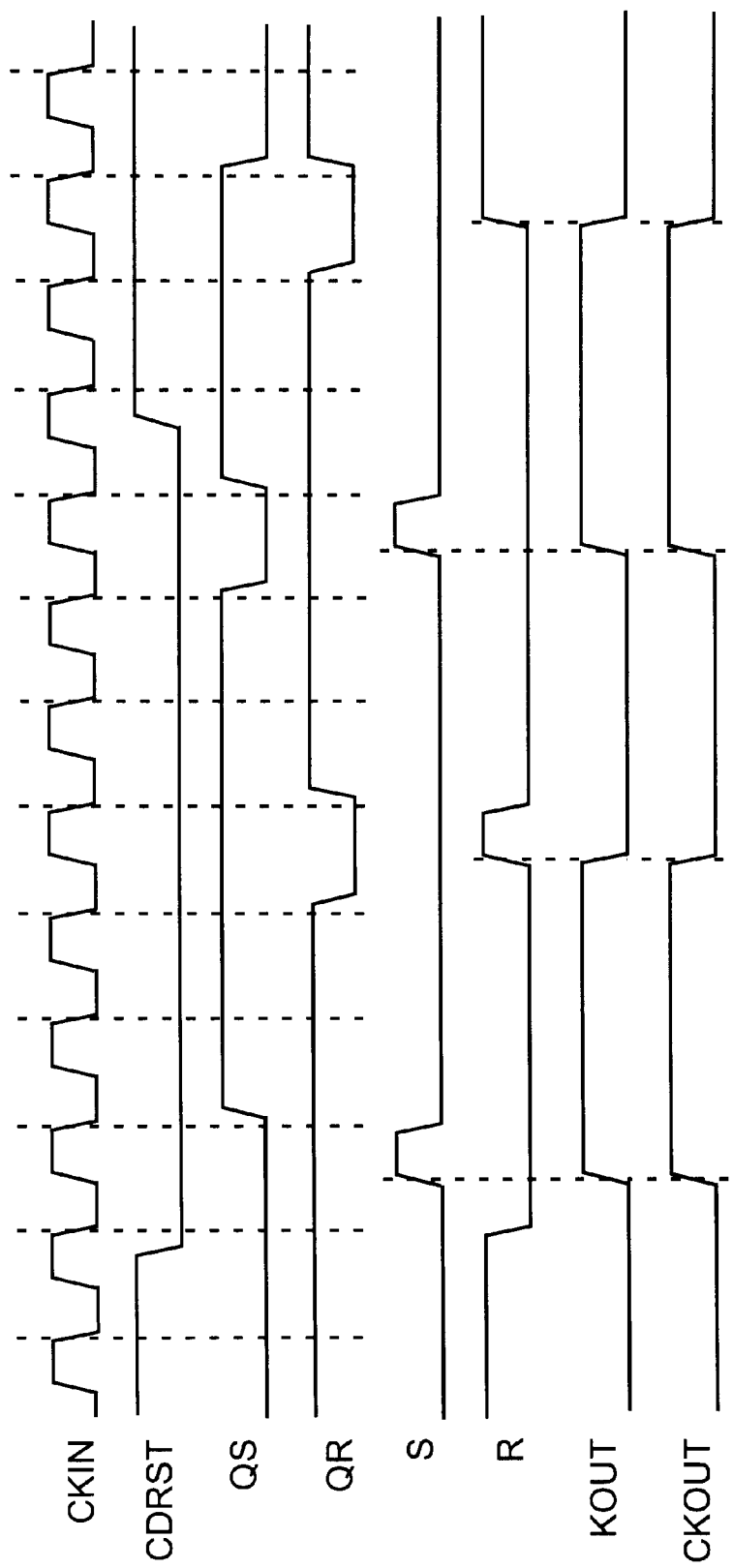
FIG. 7 is a timing diagram showing the operation of the clock divider circuit of FIG. 5 in divide-by-6 mode.

FIGS. 5 and 8–15 collectively provide a detailed schematic diagram of a programmable clock divider circuit 500 according to one embodiment of the invention. FIGS. 6 and 7 provide two exemplary timing diagrams for clock divider circuit 500, in divide-by-2 mode and divide-by-6 mode, respectively. The operation of this embodiment is now described with reference to FIGS. 5–15.

Signals used in clock divider circuit 500 include the following:

CKIN Input clock signal to the clock divider circuit.

CKOUT Output clock signal (e.g., divided clock).

CDRST Resets (and disables) the clock divider circuit when high; releases (and enables) the clock divider circuit when low.

CDEN Overrides other control signals. When high, enables the clock divider: turns off the bypass circuit BPC; enables the keeper circuit 560 to follow the S and R control signals and keep the CKOUT value stable; and releases the reset filter to the control of the RST signal. When low, disables the clock divider: turns on the bypass circuit BPC; tristates the keeper circuit 560; and turns off both pullup PU and pulldown PD. In one embodiment, signal CDEN is a value stored in a configuration memory cell, e.g., a FLASH memory cell in a CPLD or an SRAM configuration memory cell in an FPGA.

CDDIV Input signals (CDDIV0, CDDIV1, and CDDIV2) that select a divisor for the programmable clock divider. In one embodiment, control signals CDDIV0–CDDIV2 are values stored in configuration memory cells, e.g., FLASH memory cells in a CPLD or SRAM configuration memory cells in an FPGA.

CDP Provides optional phase shift. When high, the clock divider output signal CKOUT rises on the first rising edge of the input clock signal CKIN after CDRST goes low. When low, the clock divider output signal is delayed by one output clock cycle (i.e., one CKOUT cycle). For example, if the clock divider is configured to divide by 4, then the CKOUT signal rises on the fifth rising edge of the CKIN signal after CDRST goes low.

PUINIT This initialization signal is an input signal that goes high only during power-up of the PLD. It is primarily used to initialize flip-flops throughout the PLD.

Figure 5:
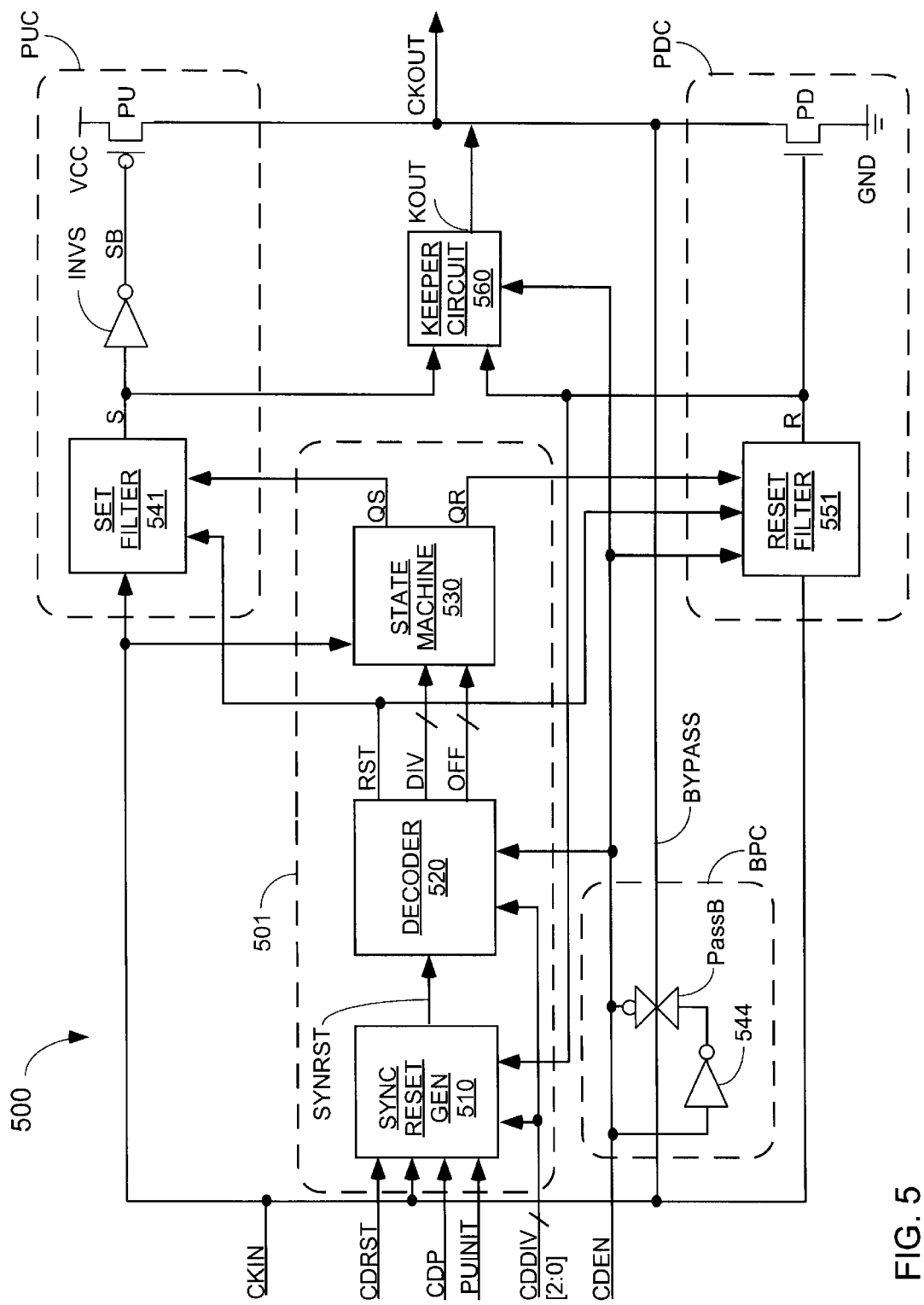
FIG. 5 is a block diagram of a clock divider circuit according to a second embodiment of the invention.

The clock divider circuit of FIG. 5 comprises a programmable control circuit 501, a pullup circuit PUC, a pulldown circuit PDC, a keeper circuit 560, and a bypass circuit BPC.

FIG. 6 is a timing diagram showing the operation of the clock divider circuit of FIG. 5 in divide-by-2 mode. As long as clock divider reset signal CDRST is high, signals QS, QR, S, and R remain at their reset values (low, high, low, and high, respectively). Programmable control circuit 501 decodes input signals CDDIV[2:0] and derives the divisor of two. When clock divider reset signal CDRST goes low, signal S goes high on the next rising edge of CKIN. Signal S then goes low again on the next falling edge of CKIN. Keeper signal KOUT remains high when signal S goes low, so signal CKOUT stays high after signal S goes low.

Signal R then goes high on the next rising edge of CKIN (because the state machine has set signal QR low) and pulls CKOUT low. Signal R then goes low again on the next falling edge of CKIN. Keeper signal KOUT remains low when signal R goes low, so signal CKOUT stays low after signal R goes low. This cycle repeats until clock divider reset signal CDRST goes high. If the clock divider is reset while signal CKOUT is high, the high pulse on signal CKOUT is completed.

FIG. 7 is a timing diagram showing the operation of the clock divider circuit of FIG. 5 in divide-by-6 mode. The timing diagram is similar to that of FIG. 6, except that signals QS and QR go low only every sixth clock cycle instead of every other clock cycle, and the signals dependent upon QS and QR occur less frequently in consequence.

Bypass Circuit

Bypass circuit BPC provides a way of bypassing and disabling the clock divider function of the clock divider circuit. Passgate PassB is situated between input clock terminal CKIN and output clock terminal CKOUT. In the pictured embodiment, passgate PassB is a CMOS passgate, with the PMOS control terminal coupled to CDEN and the NMOS control terminal coupled to the inverse signal generated by inverter 544. When clock divider enable signal CDEN is high, the passgate is off. When clock divider enable signal CDEN is low, the passgate is on.

Programmable Control Circuit

In the embodiment of FIG. 5, programmable control circuit 501 comprises synchronized reset generator 510, a decoder 520, and a state machine 530.

Synchronized reset 510 provides an appropriately delayed version of the clock divider reset signal CDRST. The number of CKIN clock cycles by which the reset signal is delayed is controlled by the three control signals CDDIV0–CDDIV2.

Figure 8:
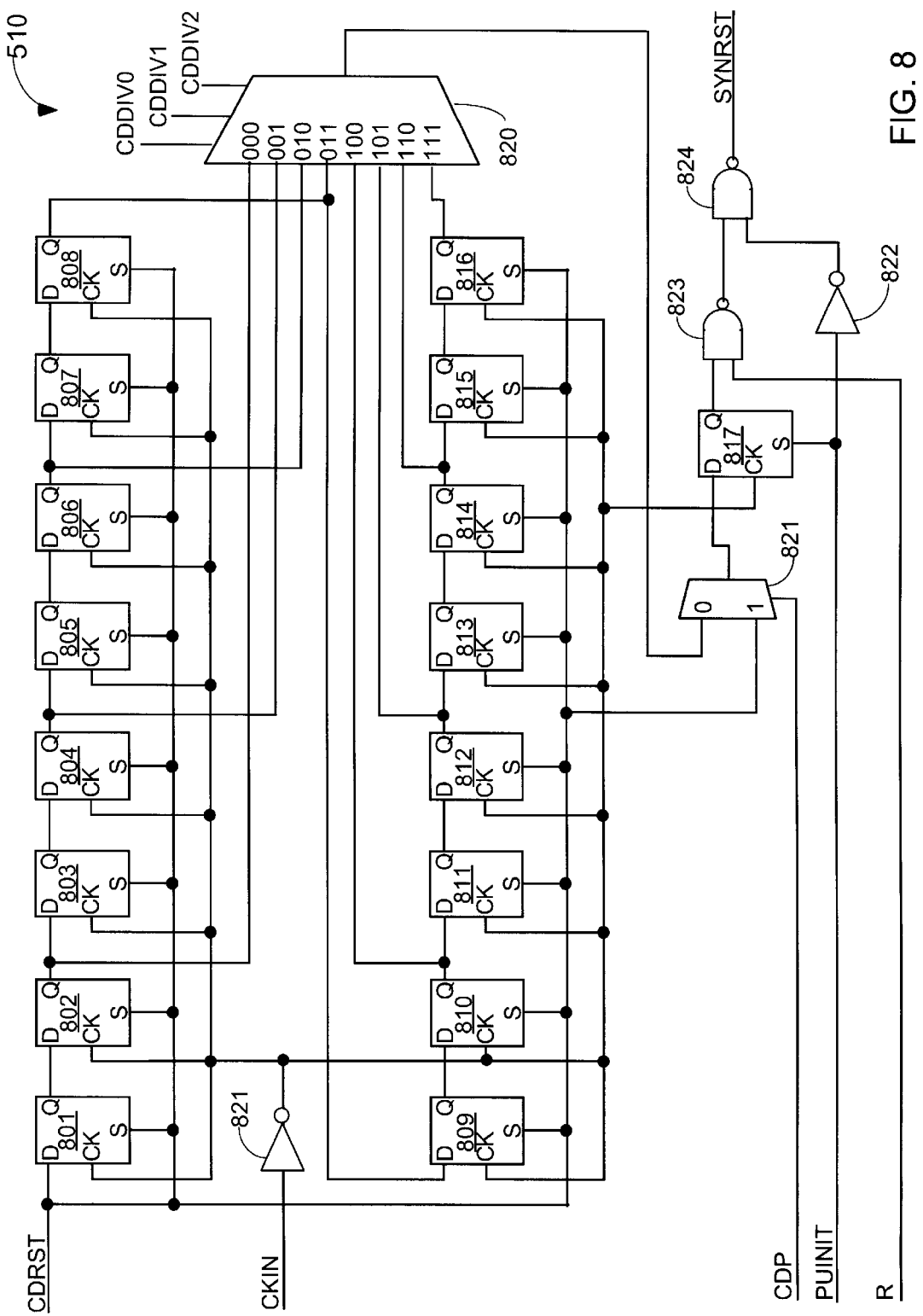
FIG. 8 is a block diagram of an enable signal generator circuit that can be used with the clock divider circuit of FIG. 5.

One embodiment of synchronized reset 510 is shown in FIG. 8. Synchronized reset 510 comprises 16 set flip-flops 801–816 coupled in series. The Q outputs of the even-number flip-flops are provided to an 8-to-1 multiplexer 820, which is controlled by control signals CDDIV0–CDDIV2. In the pictured embodiment, the CDDIV values correspond to the divide-by value (devisor) of the clock divider as shown in Table 1.

TABLE 1

| CDDIV[0–2] | DIVISOR |
|---|---|
| 000 | 2 |
| 001 | 4 |
| 010 | 6 |
| 011 | 8 |
| 100 | 10 |
| 101 | 12 |
| 110 | 14 |
| 111 | 16 |

The output of multiplexer 820 is a signal that mirrors the clock divider reset signal CDRST, but is delayed by a selected number of CKIN clock cycles. The output of multiplexer 820 drives the "0" data terminal of 2-to-1 multiplexer 821. The "1" input terminal is driven by the CDRST signal, and one of the two inputs is selected by control signal CDP, which is described above.

the output of multiplexer 821 is stored in set flip-flop 817, which drives NAND-gate 823. The set terminal of flip-flop 817 is driven by signal PUINIT, which is described above. The other input to NAND-gate 823 is reset control signal R, from pulldown circuit PDC. NAND-gate 823 is NANDed with the inverse of signal PUINIT (which goes high only during power-up to initialize all flip-flops on the PLD) to generate reset signal SYNRST.

The R input to NAND-gate 823 provides an additional capability, If the clock divider is reset while signal CKOUT is high, the feedback from the reset control signal R ensures that the last clock cycle on signal CKOUT is completed.

Figure 9:
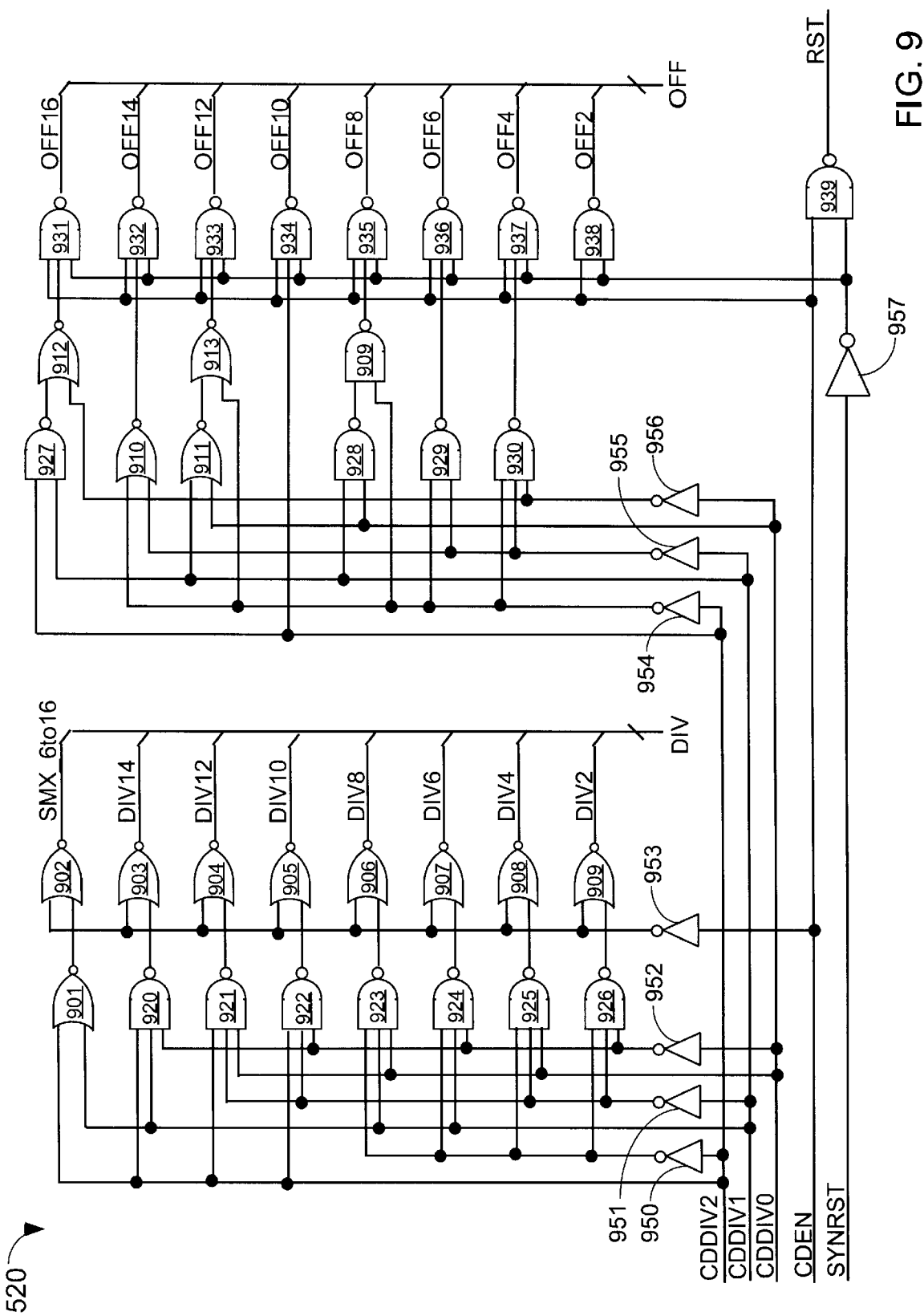
FIG. 9 is a block diagram of a decoder circuit that can be used with the clock divider circuit of FIG. 5.

FIG. 9 shows one embodiment of decoder 520. The pictured embodiment includes NOR-gates 901–913, NAND-gates 920–939, and inverters 950–957. Decoder 520 decodes signals CDDIV0–CDDIV2 and generates from these signals control signals DIV2–DIV14 and SMX_6to16, which form a bus labeled "DIV" in FIGS. 9 and 5. The decoder also generates from signals CDDIV0–CDDIV2 control signals OFF2–OFF16, which form a bus labeled "OFF" in FIGS. 9 and 5. All of these signals are used to control state machine 530. Decoding tables for decoder 520 are provided in Tables 2A and 2B, where a "1" is high, a "0" is low, and an "x" is a don't-care value.

Additionally, in decoder 520 another reset signal, RST, is generated from clock divider enable signal CDEN and reset signal SYNRST. This reset signal is used to reset the set and reset filters in the pullup and pulldown circuits, respectively.

TABLE 2A

| CDDIV | | | | DIV | | | | | | |
|---|---|---|---|---|---|---|---|---|---|---|
| CDEN | 2 | 1 | 0 | SMX 6 to 16 | 14 | 12 | 10 | 8 | 6 | 4 | 2 |
| 0 | x | x | x | 0 | 0 | 0 | 0 | 0 | 0 | 0 | 0 |
| 1 | 0 | 0 | 0 | 0 | 0 | 0 | 0 | 0 | 0 | 0 | 1 |
| 1 | 0 | 0 | 1 | 0 | 0 | 0 | 0 | 0 | 0 | 1 | 0 |
| 1 | 0 | 1 | 0 | 1 | 0 | 0 | 0 | 0 | 1 | 0 | 0 |
| 1 | 0 | 1 | 1 | 1 | 0 | 0 | 0 | 1 | 0 | 0 | 0 |
| 1 | 1 | 0 | 0 | 1 | 0 | 0 | 1 | 0 | 0 | 0 | 0 |
| 1 | 1 | 0 | 1 | 1 | 0 | 1 | 0 | 0 | 0 | 0 | 0 |
| 1 | 1 | 1 | 0 | 1 | 1 | 0 | 0 | 0 | 0 | 0 | 0 |
| 1 | 1 | 1 | 1 | 1 | 0 | 0 | 0 | 0 | 0 | 0 | 0 |

TABLE 2B

| CDDIV | | | OFF | | | | | | | |
|---|---|---|---|---|---|---|---|---|---|---|
| CDEN | 2 | 1 | 0 | 16 | 14 | 12 | 10 | 8 | 6 | 4 | 2 |
| 0 | x | x | x | 0 | 0 | 0 | 0 | 0 | 0 | 0 | 0 |
| 1 | 0 | 0 | 0 | 1 | 1 | 1 | 1 | 1 | 1 | 1 | 0 |
| 1 | 0 | 1 | 0 | 1 | 1 | 1 | 1 | 1 | 0 | 0 | 0 |
| 1 | 0 | 1 | 1 | 1 | 1 | 1 | 1 | 0 | 0 | 0 | 0 |
| 1 | 1 | 0 | 0 | 1 | 1 | 1 | 0 | 0 | 0 | 0 | 0 |
| 1 | 1 | 0 | 1 | 1 | 1 | 0 | 0 | 0 | 0 | 0 | 0 |
| 1 | 1 | 1 | 0 | 1 | 0 | 0 | 0 | 0 | 0 | 0 | 0 |
| 1 | 1 | 1 | 1 | 0 | 0 | 0 | 0 | 0 | 0 | 0 | 0 |

Figures 10, 10A:
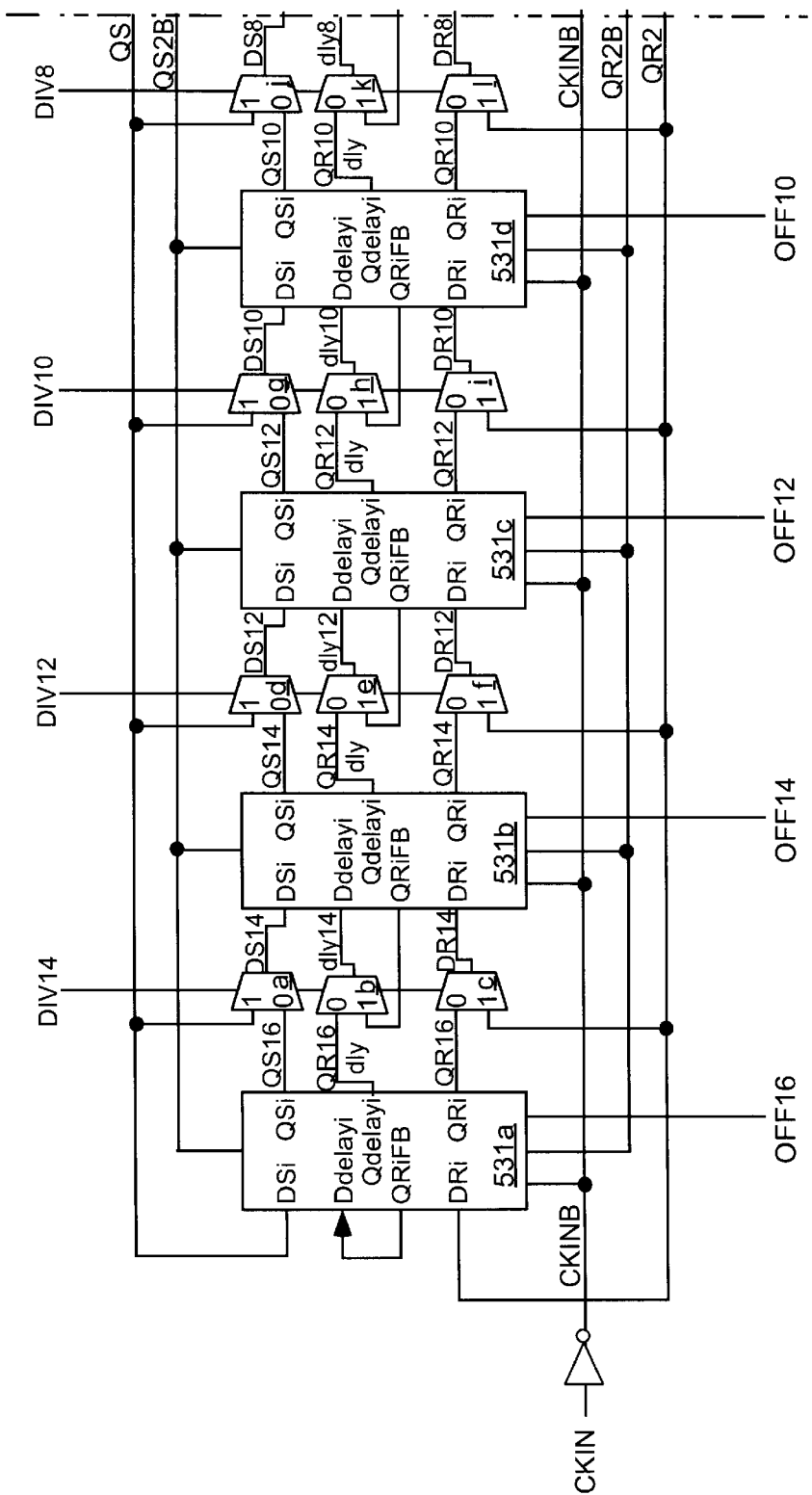
FIG. 10 (comprising FIGS. 10A and 10B) is a block diagram of a state machine that can be used with the clock divider circuit of FIG. 5.
Figure 10B:
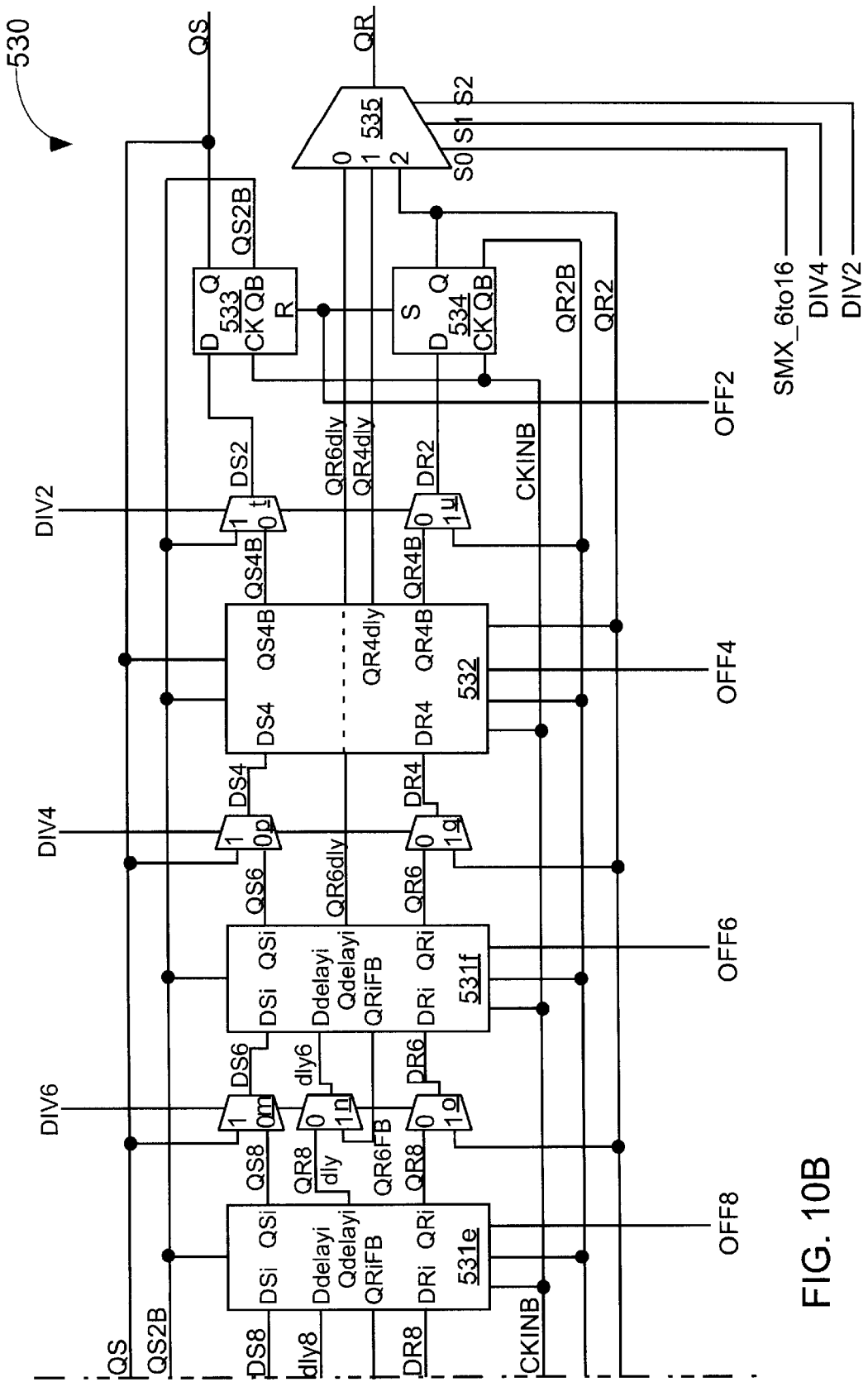

FIG. 10 (comprising FIGS. 10A and 10B) is a block diagram of one embodiment of state machine 530. State machine 530 is controlled by the DIV and OFF buses from decoder 520, and provides the QS and QR control signals to the set and reset filters in the pullup and pulldown circuits (respectively). State machine 530 comprises seven serially connected sub-cells (logic blocks 531a–f and 532), as shown in FIG. 10. Signals DIV14–DIV2 control the serial connections between the blocks, via multiplexers a–q and t–u. When the clock divider is enabled (i.e., when CDEN is high), exactly one of DIV signals DIV14–DIV2 is high (see Table 2A). Therefore, all but one of the sub-cells passes values from left to right along the chain. The selected sub-cell places its QS and QR values on the chain.

For example, when the divisor is 6, signal DIV6 is high. Therefore, sub-cell 531f is the sub-cell that places signal QS onto the chain via its DS6 terminal. Similarly, the value QR6FB is placed onto the dly6 (Ddelay6) terminal, and signal QR2 is placed on the DR6 terminal, of sub-cell 531f. The selected QS and QR values are then passed to flip-flops 533 and 534, respectively. The set control signal QS is supplied by flip-flop 533. The reset control signal QR is supplied by multiplexer 535, which selects among the values QR6dly, QR4dly, and QR2 based on the values of signals SMX_6 to 16, DIV4, and DIV2.

The delay chain (the chain from Ddelayi to Qdelayi across the sub-cells of the state machine) provides an automatic duty cycle correction capability. This circuitry ensures that the low pulse on the QR signal always occurs midway between low pulses on the QS signal. (See, for example, the timing diagram in FIG. 7.) As will be seen in FIG. 11, the delay on the delay chain through each sub-cell is half that of the delay on the chains from DSi to QSi, and from DRi to QRi. Further, the delay chain contributes to the formation of the QR control signal. Therefore, the duty cycle of the divided clock signal is always 50%.

Figure 11:
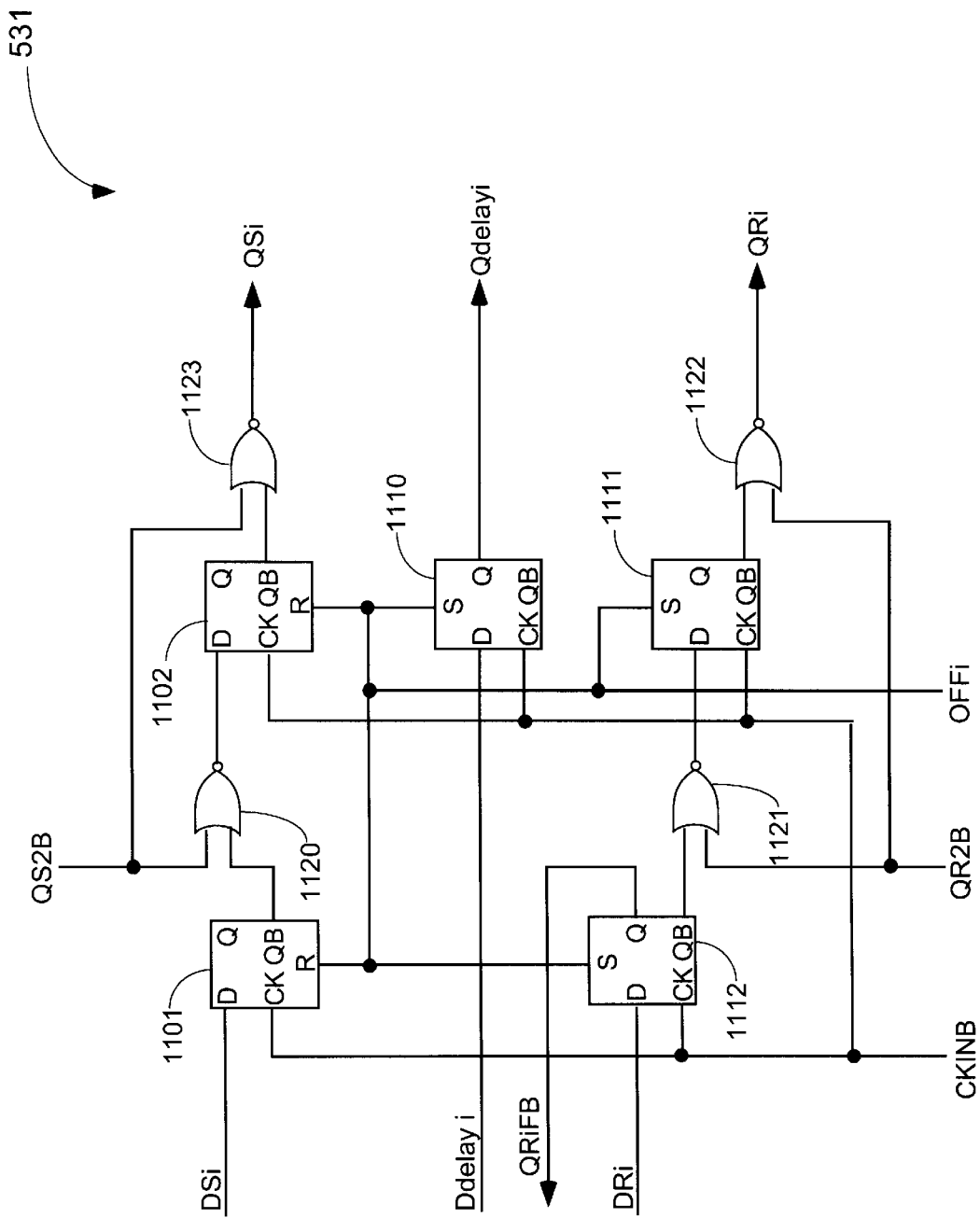
FIG. 11 is a block diagram of a first sub-cell of the state machine of FIG. 10.

FIG. 11 is a block diagram of a first sub-cell 531 of the state machine of FIG. 10. Sub-cell 531 comprises reset flip-flops 1101–1102, set flip-flops 1110–1112, and NOR-gates 1120–1123. Signal DSi is passed through flip-flop 1101, NOR-gate 1120 (if signal QS2B is low), flip-flop 1102, and NOR-gate 1123 (if signal QS2B is low) to output terminal QSi. Signal Ddelayi is passed through flip-flop 1110 to output terminal Qdelayi. Signal DRi is passed through flip-flop 1112 to NOR-gate 1121, and is also fed back to output terminal QRiFB. When signal QR2B is low, NOR-gate 1121 passes the inverted output of flip-flop 1112 to flip-flop 1111, and hence to NOR-gate 1122, which has signal QR2B as its other input. NOR-gate 1122 provides output signal QRi.

Figure 12:
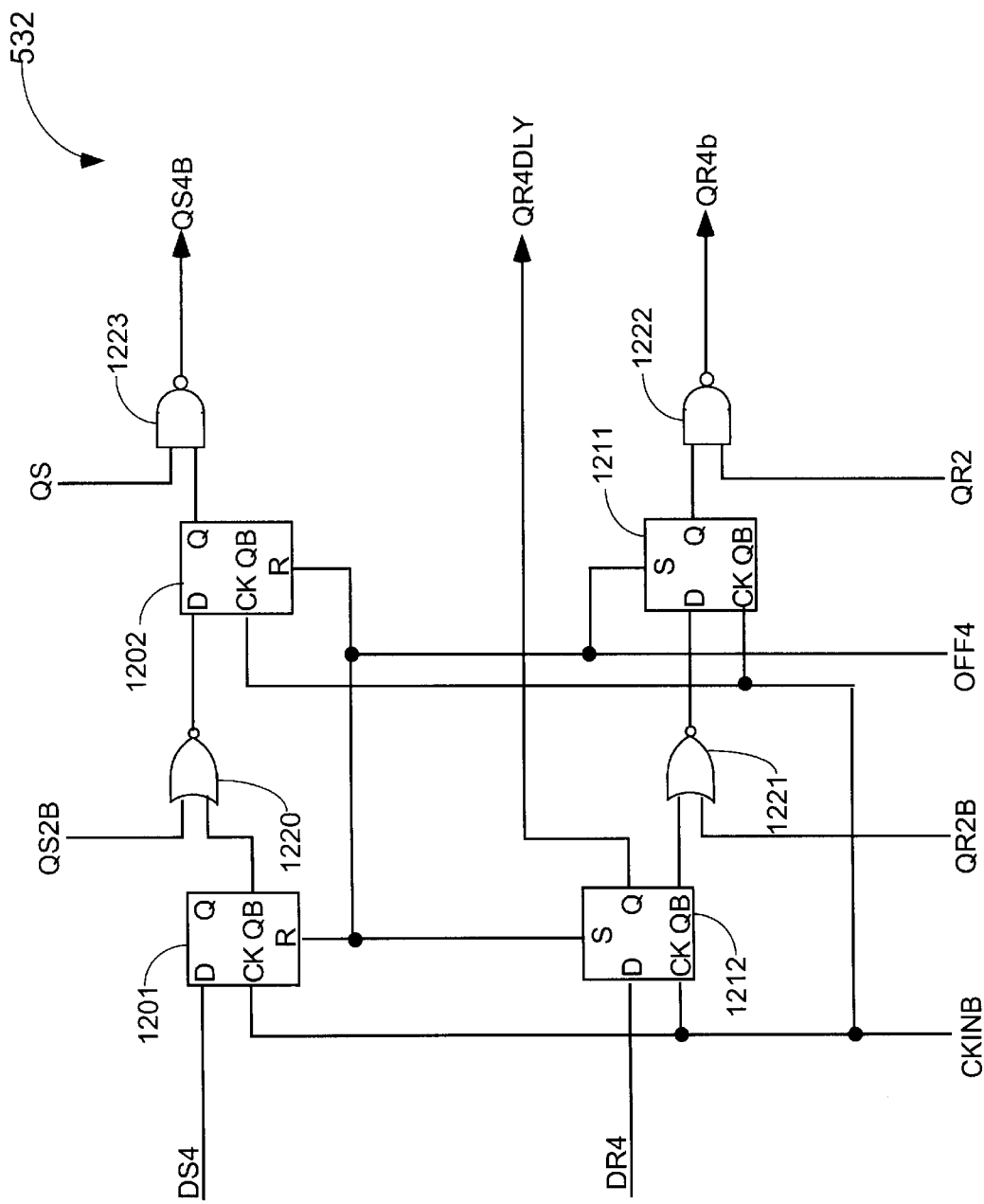
FIG. 12 is a block diagram of a second sub-cell of the state machine of FIG. 10.

FIG. 12 is a block diagram of a second sub-cell 532 of the state machine of FIG. 10. Sub-cell 532 is similar to sub-cell 531, except that the signal QR4DLY is the output of flip-flop 1212.

Figure 13:
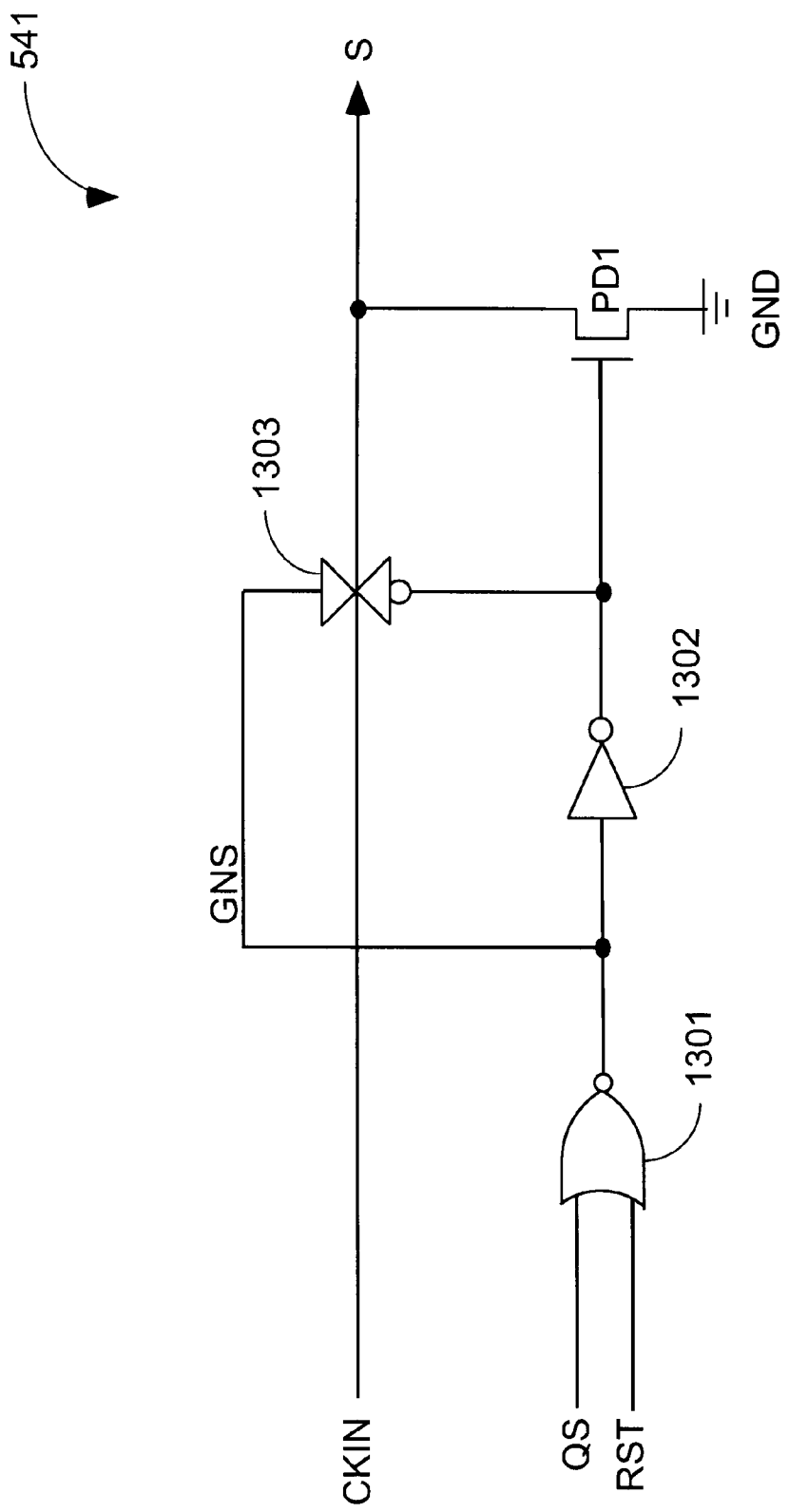
FIG. 13 is a block diagram of a set filter circuit that can be used with the clock divider circuit of FIG. 5.

FIG. 13 is a block diagram of set filter circuit 541. As can be seen in FIG. 5, the set filter circuit controls the pullup PU on the clock output signal CKOUT. The set filter circuit accepts control signal QS from the state machine and uses the QS signal to filter clock pulses on input clock signal CKIN. In other words, based on the value of signal QS, pulses on signal CKIN are or are not passed on to signal S.

In the pictured embodiment, set filter circuit 541 comprises NOR-gate 1301, inverter 1302, passgate 1303, and pulldown PD1. Passgate 1303 is placed between input terminal CKIN and output terminal S. NOR-gate 1301 accepts signals QS and RST as inputs and provides signal GNS, which controls the NMOS terminal of passgate 1303. Signal GNS also drives inverter 1302, which controls the PMOS terminal of passgate 1303 and also controls pulldown PD1. Pulldown PD1 is coupled between output terminal S and ground GND.

Figure 14:
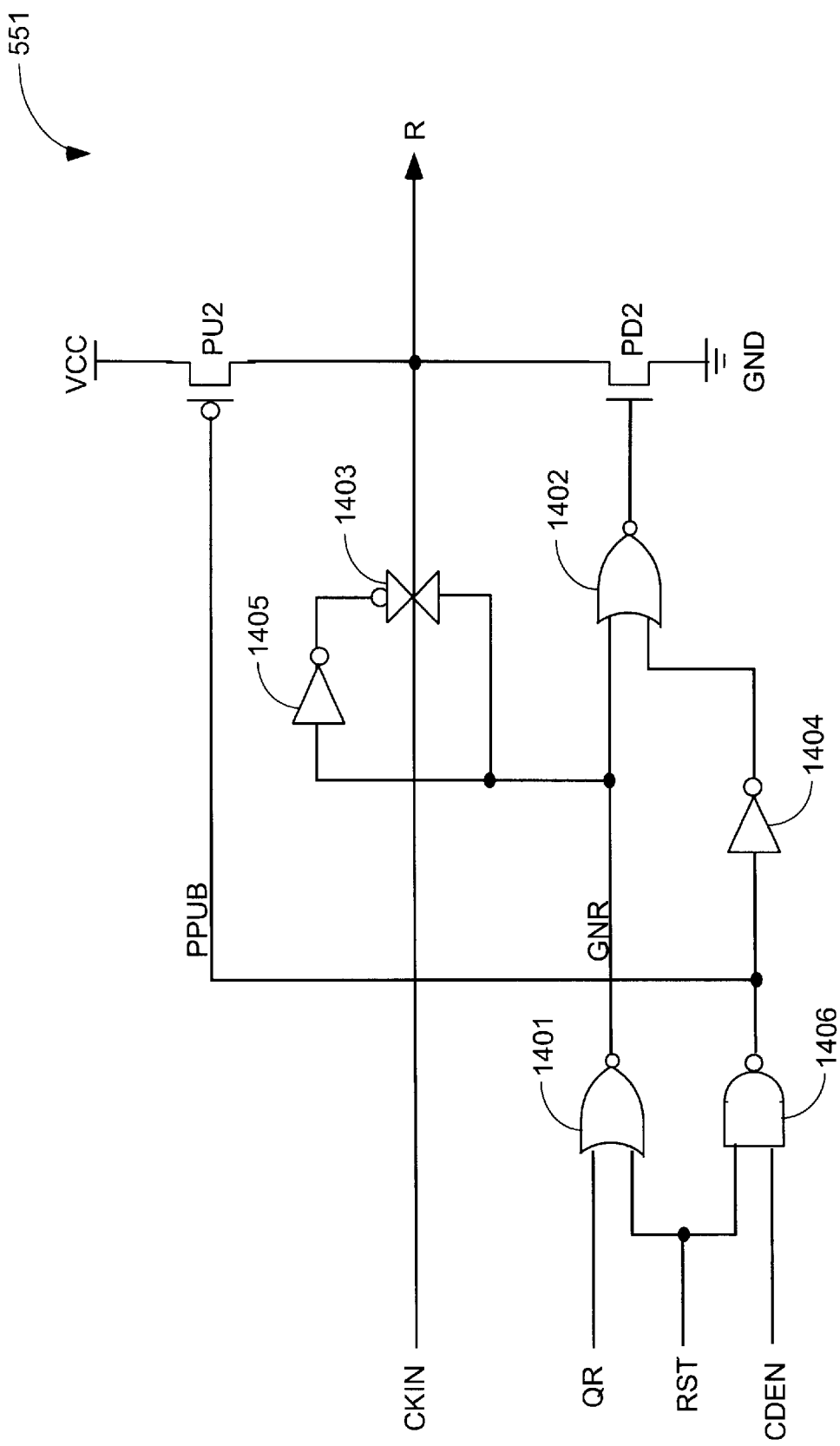
FIG. 14 is a block diagram of a reset filter circuit that can be used with the clock divider circuit of FIG. 5.

FIG. 14 is a block diagram of reset filter circuit 551. As can be seen in FIG. 5, the reset filter circuit controls the pulldown PD on the clock output signal CKOUT. The reset filter circuit accepts control signal QR from the state machine and uses the QR signal to filter clock pulses on input clock signal CKIN. In other words, based on the value of signal QR, pulses on signal CKIN are or are not passed on to signal R.

In the pictured embodiment, reset filter circuit 551 comprises.NOR-gates 1401 and 1402, NAND-gate 1406, inverters 1404 and 1405, passgate 1403, pullup PU2, and pulldown PD2. Passgate 1403 is placed between input terminal CKIN and output terminal R. NOR-gate 1401 accepts signals QR and RST as inputs and provides signal GNR, which controls the NMOS terminal of passgate 1403. Signal GNR also drives inverter 1405, which controls the PMOS terminal of passgate 1403, and also drives a first input of NOR-gate 1402. NOR-gate 1402 controls pulldown PD2, which is coupled between output terminal R and ground GND. NAND-gate 1406 accepts signals CDEN and RST as inputs and provides signal PPUB. Signal PPUB controls pullup PU2, which is coupled between output terminal R and power high VCC. Signal PPUB also drives inverter 1404, which provides the second input to NOR-gate 1402.

Figure 15:
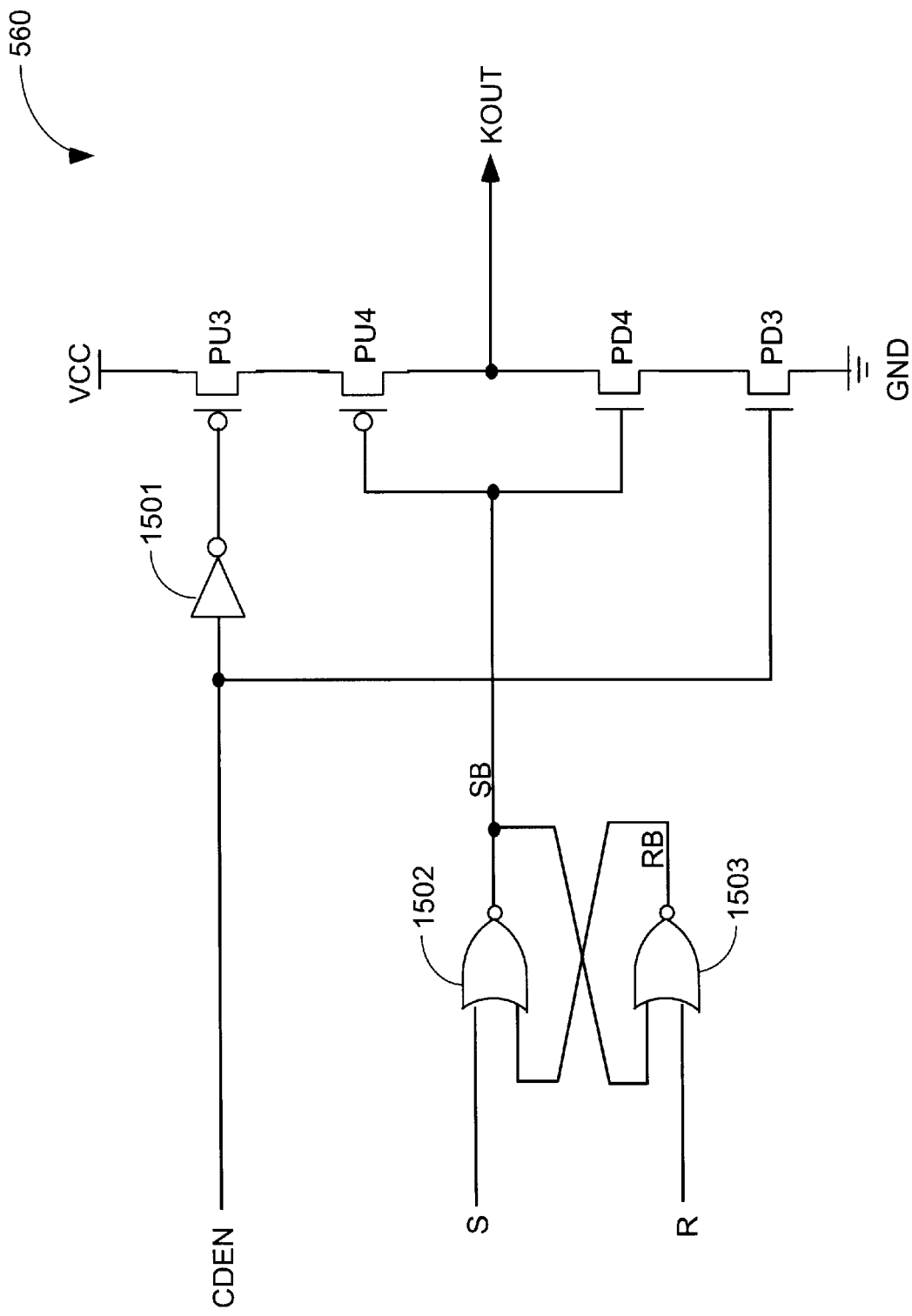
FIG. 15 is a block diagram of a keeper circuit that can be used with the clock divider circuit of FIG. 5.

FIG. 15 is a block diagram of keeper circuit 560. Keeper circuit 560 comprises pullups PU3 and PU4, and pulldowns PD4 and PD3, serially coupled between power high VCC and ground GND. Output terminal KOUT is coupled between pullup PU4 and pulldown PD4. Clock divider enable signal CDEN drives pulldown PD3 directly, and pullup PU3 through inverter 1501. Thus, when signal CDEN is low, both pullup PU3 and pulldown PD3 are off, and the signal at output terminal KOUT is tristated. Pullup PU4 and pulldown PD4 are both driven by signal SB. Signals SB and RB are provided by cross-coupled NOR-gates 1502 and 1503, respectively. The other input to NOR-gate 1502 is the S signal from set filter 541. The other input to NOR-gate 1503 is the R signal from reset filter 551.

In the various embodiments of this invention, novel structures have been described for clock driver circuits and clock divider circuits. The various embodiments of the structures and methods of this invention that are described above are illustrative only of the principles of this invention and are not intended to limit the scope of the invention to the particular embodiments described. For example, in view of this disclosure those skilled in the art can define other state machines, keeper circuits, passgates, inverters, pullups, pulldowns, tristateable clock dividers, buffers, multiplexers, and so forth, and use these alternative features to create a method, circuit, or system according to the principles of this invention. Thus, the invention is limited only by the following claims.

What is claimed is:

1. A clock divider circuit, comprising:

a clock input terminal;

a clock output terminal;

a state machine having an input terminal coupled to the clock input terminal, and further having set and reset output terminals;

a keeper circuit having an output terminal coupled to the clock output terminal;

a pullup circuit having a data input terminal coupled to the clock input terminal, a control input terminal coupled to the set output terminal of the state machine, and an output terminal coupled to the clock output terminal; and a pulldown circuit having a data input terminal coupled to the clock input terminal, a control input terminal coupled to the reset output terminal of the state machine, and an output terminal coupled to the clock output terminal.

2. The clock divider circuit of claim 1, wherein the pullup circuit comprises:

a passgate coupled between the clock input terminal and a passgate output terminal, the passgate having a first gate terminal coupled to the set output terminal of the state machine; and a pullup coupled between power high and the clock output terminal, the pullup having a gate terminal coupled to the passgate output terminal.

3. The clock divider circuit of claim 2, wherein:

the pullup circuit further comprises a first inverter;

the pullup is a PMOS transistor; and the gate terminal of the pullup is coupled to the passgate output terminal through the first inverter.

4. The clock divider circuit of claim 2, wherein:

the pullup circuit further comprises a second inverter; and the passgate is a CMOS passgate having a second gate terminal coupled to the set output terminal of the state machine through the second inverter.

5. The clock divider circuit of claim 1, wherein the pulldown circuit comprises:

a passgate coupled between the clock input terminal and a passgate output terminal, the passgate having a first gate terminal coupled to the reset output terminal of the state machine; and a pulldown coupled between the clock output terminal and ground, the pulldown having a gate terminal coupled to the passgate output terminal.

6. The clock divider circuit of claim 5, wherein:

the pulldown circuit further comprises an inverter;

the pulldown is an NMOS transistor; and the passgate is a CMOS passgate having a second gate terminal coupled to the reset output terminal of the state machine through the inverter.

7. The clock divider circuit of claim 1, wherein the state machine includes a programmable divisor selection circuit.

8. The clock divider circuit of claim 7, wherein the clock divider circuit forms a portion of a programmable logic device (PLD).

9. A programmable clock divider circuit, comprising:

a clock input terminal;

a clock output terminal;

a programmable control circuit having an input terminal coupled to the clock input terminal, and further having set and reset output terminals;

a pullup circuit having a data input terminal coupled to the clock input terminal, a control input terminal coupled to the set output terminal of the programmable control circuit, a set output terminal, and a clock output terminal coupled to the clock output terminal;

a pulldown circuit having a data input terminal coupled to the clock input terminal, a control input terminal coupled to the reset output terminal of the programmable control circuit, a reset output terminal, and a clock output terminal coupled to the clock output terminal; and a keeper circuit having an output terminal coupled to the clock output terminal.

10. The clock divider circuit of claim 9, wherein the pullup circuit comprises:

a passgate coupled between the clock input terminal and an output terminal, the passgate having a first gate terminal coupled to the set output terminal of the state machine; and a pullup coupled between power high and the clock output terminal, the pullup having a gate terminal coupled to the output terminal of the passgate.

11. The clock divider circuit of claim 10, wherein:

the pullup circuit further comprises a first inverter;

the pullup is a PMOS transistor; and the gate terminal of the pullup is coupled to the output terminal of the passgate through the first inverter.

12. The clock divider circuit of claim 9, wherein the pulldown circuit comprises:

a passgate coupled between the clock input terminal and an output terminal, the passgate having a first gate terminal coupled to the reset output terminal of the state machine; and a pulldown coupled between the clock output terminal and ground, the pulldown having a gate terminal coupled to the output terminal of the passgate.

13. The clock divider circuit of claim 9, wherein the programmable control circuit comprises:

a state machine having set and reset output terminals coupled to the set and reset output terminals of the programmable control circuit.

14. The clock divider circuit of claim 13, wherein the programmable control circuit further comprises:

a decoder circuit having a plurality of input terminals accepting programming data, and further having a plurality of programming data output terminals coupled to programming data input terminals of the state machine.

15. The clock divider circuit of claim 14, wherein the clock divider circuit forms a portion of a programmable logic device (PLD).

16. The clock divider circuit of claim 15, wherein the programming data comprises configuration data for the PLD.

* * * * *